United States Patent [19]

Choi

[11] Patent Number: 5,836,000
[45] Date of Patent: Nov. 10, 1998

[54] PHASE LOCKED LOOP HAVING AUTOMATIC FREE RUNNING FREQUENCY ADJUSTMENT

[75] Inventor: Byung-Kuen Choi, Kyungki-do, Rep. of Korea

[73] Assignee: Samsung Electronics, Co., Ltd., Suwon, Rep. of Korea

[21] Appl. No.: 764,641

[22] Filed: Dec. 11, 1996

[30] Foreign Application Priority Data

Dec. 11, 1995 [KR] Rep. of Korea ..................... 95-48407

[51] Int. Cl.[6] ........................................................ H03L 7/093
[52] U.S. Cl. .............................. 331/14; 331/1 A; 331/8; 331/17; 331/25
[58] Field of Search ............................ 331/1 A, 10, 11, 331/17, 25, 8, 14

[56] References Cited

U.S. PATENT DOCUMENTS 4,633,488  12/1986  Shaw ........................................ 331/1 A
5,382,922   1/1995  Gersbach et al. ........................ 331/11

*Primary Examiner*—Siegfried H. Grimm
*Attorney, Agent, or Firm*—Marger, Johnson, McCollom, & Stolowitz, P.C.

[57] ABSTRACT

The capture range and stability of a phase locked loop are improved by adjusting the free running frequency of a voltage controlled oscillator in response to the output signal of the phase locked loop. The output signal is filtered and amplified, and then compared to a reference signal from the voltage controlled oscillator which is indicative of the free running frequency. A direct current level capture circuit compares the filtered and amplified output signal with the reference signal and generates a control signal which adjusts the free running frequency so as to equalize the output signal and the reference signal. The control signal is generated by sequentially and consecutively enabling a series of filter reset circuits. A switch control circuit controls two feedback paths between the phase detector and the voltage controlled oscillator. The first feedback path includes a low pass filter and is selected by the switch circuit for normal operation. During capture operation, the second feedback path, which includes a low pass filter in series with a DC level converter, is selected. The switch circuit is controlled by a switch select signal which is generated by the direct current level capture circuit.

19 Claims, 12 Drawing Sheets

PHASE LOCKED LOOP HAVING AUTOMATIC FREE RUNNING FREQUENCY ADJUSTMENT

This application corresponds to Korean Patent application No. 95-48407 filed Dec. 11, 1995 in the name of Samsung Electronics Co., Ltd. and incorporated herein by reference.

BACKGROUND OF THE INVENTION

1. Field of the Invention

This invention relates generally to phase locked loops and more particularly to a phase locked loop circuit having a direct current capture circuit for automatically adjusting the free running frequency of a voltage controlled oscillator.

2. Description of the Related Art

FIG. 1 is a block diagram of a conventional phase locked loop (PLL) circuit. Generally, the phase detector works as a demodulator which demodulates a phase modulated signal. In practical applications, the PLL circuit is used as amplitude modulator, frequency modulator, frequency synthesizer, pulse synchronizer, voice demodulator, frequency multiplier, etc.

As shown in FIG. 1, a conventional PLL comprises a phase detector 1, a low pass filter 2, an amplifier 3 and a voltage controlled oscillator (VCO) 4. The voltage controlled oscillator 4 is an oscillator which outputs an oscillating frequency in response to the control voltage, and the phase detector 1 is a detector which detects the phase difference between the two input frequencies and outputs a signal in response to the phase difference.

The phase detector 1 receives and compares an input-signal having a frequency Fin with a vco-signal having a frequency Fvco, and outputs a first signal having a difference frequency Fdiff in response to the phase difference between the frequencies of the two input signals. The first signal is attenuated by the low pass filter 2 when the difference-frequency is higher than the pre-set attenuation frequency of the low pass filter 2. The output voltage of the low pass filter 2 is amplified by the amplifier 3. The voltage controlled oscillator 4 outputs a signal-frequency to the phase detector 1 in response to the output voltage Vcon of the amplifier 3. Hereinafter, the output voltage Vcon of the amplifier 3 is called a control voltage.

In operation, the phase detector 1 produces the first signal having a difference-frequency Fdiff in response to phase difference of the input-frequency Fin and the signal frequency Fvco. The signal is then filtered by the low pass filter 2 and amplified by the amplifier 3. In a practical application, the input-frequency Fin is typically a modulated signal. The output voltage from the amplifier 3 (the control voltage) controls the signal frequency Fvco to have the same frequency with the input frequency. In other words, if the input-frequency and the signal-frequency are different from each other, the difference is detected and fed back to the phase detector 1 to decrease the difference via the VCO 4. When the signal frequency Fvco has the same value with the input frequency, the VCO is said to be in the "lock-in" condition, and the signal frequency Fvco varies along with (captures) variations of the input frequency.

Prior to operation, when the input signal is not input to the PLL, the first voltage from the phase detector is 0 V, and the VCO outputs its pre-set (intrinsic) oscillating frequency known as its "free running frequency". Then, when the input signal (modulation signal) is input to the PLL, the phase detector compares the input signal with the vco-signal and produces a voltage that varies in response to the phase difference of the input frequency Fin and the vco-signal frequency Fvco. When the input signal has the same frequency as the vco-signal, that is, when the PLL is "locked-in", the output voltage of the PLL (control voltage) varies along with the variation of the input frequency. In the "lock-in" condition, the control voltage is approximately a direct current, and is a demodulated signal which is similar to its original signal before the modulation. However, when the difference is greater than a predetermined value, the VCO does not oscillate in the "lock-in" condition, but oscillates at its free running frequency.

The range of input frequencies in which the PLL can work continuously in "lock-in" condition is called the "Lock Range". The range of input frequencies in which the PLL can "lock-in" from its free running condition is called the "Capture Range". Generally, the "lock range" is broader than the "Capture Range". However, with prior art PLL's, since the VCO has its own pre-set free running frequency, and since peripheral elements with which the PLL is used vary according to the application, a broader capture range is needed.

Accordingly, a need remains for an improved PLL circuit.

SUMMARY OF THE INVENTION

Therefore, it is an object of the present invention to improve the capture range of a phase locked loop.

Another object of the present invention is to provide a phase locked loop circuit which provides more stable input signal capture.

To accomplish these and other objects, a PLL in accordance with the present invention provides a direct current level capturing circuit for automatically adjusting the control voltage of the voltage controlled oscillator. Since the free running frequency of voltage controlled oscillator is adjusted by controlling the direct current input to the VCO, adjusting the free running frequency of the VCO improves the operation of the PLL and allows the PLL to operate in the "lock-in" condition.

The capture range and stability of a phase locked loop are improved by adjusting the free running frequency of a voltage controlled oscillator in response to the output signal of the phase locked loop. The output signal is filtered and amplified, and then compared to a reference signal from the voltage controlled oscillator which is indicative of the free running frequency. A direct current level capture circuit compares the filtered and amplified output signal with the reference signal and generates a control signal which adjusts the free running frequency so as to equalize the output signal and the reference signal.

A switch control circuit controls two feedback paths between the phase detector and the voltage controlled oscillator. The first feedback path includes a low pass filter and is selected by the switch circuit for normal operation. During capture operation, the second feedback path, which includes a low pass filter in series with a DC level converter, is selected. The switch circuit is controlled by a switch select signal which is generated by the direct current level capture circuit.

One aspect of the present invention is a phase locked loop including a phase detector for generating an output signal responsive to an input signal and an oscillator signal and a controlled oscillator coupled to the phase detector to generate the oscillator signal responsive to the output signal. The free running frequency of the controlled oscillator is controlled responsive to a control signal. The phase locked loop also includes a control circuit coupled to the controlled oscillator to generate the control signal responsive to the output signal. The controlled oscillator generates a reference signal indicative of the free running frequency, and the control circuit generates the control signal so as to equalize the reference signal and the output signal.

Another aspect of the present invention is a method of operating a phase locked loop comprising adjusting the free running frequency of a controlled oscillator responsive to the output signal from the phase locked loop. The controlled oscillator generates a reference signal indicative of the free running frequency, and the free running frequency is adjusted by adjusting the free running frequency so as to equalize the reference signal and the output signal.

The foregoing and other objects, features and advantages of the invention will become more readily apparent from the following detailed description of a preferred embodiment of the invention which proceeds with reference to the accompanying drawings.

DETAILED DESCRIPTION

Figure 2:
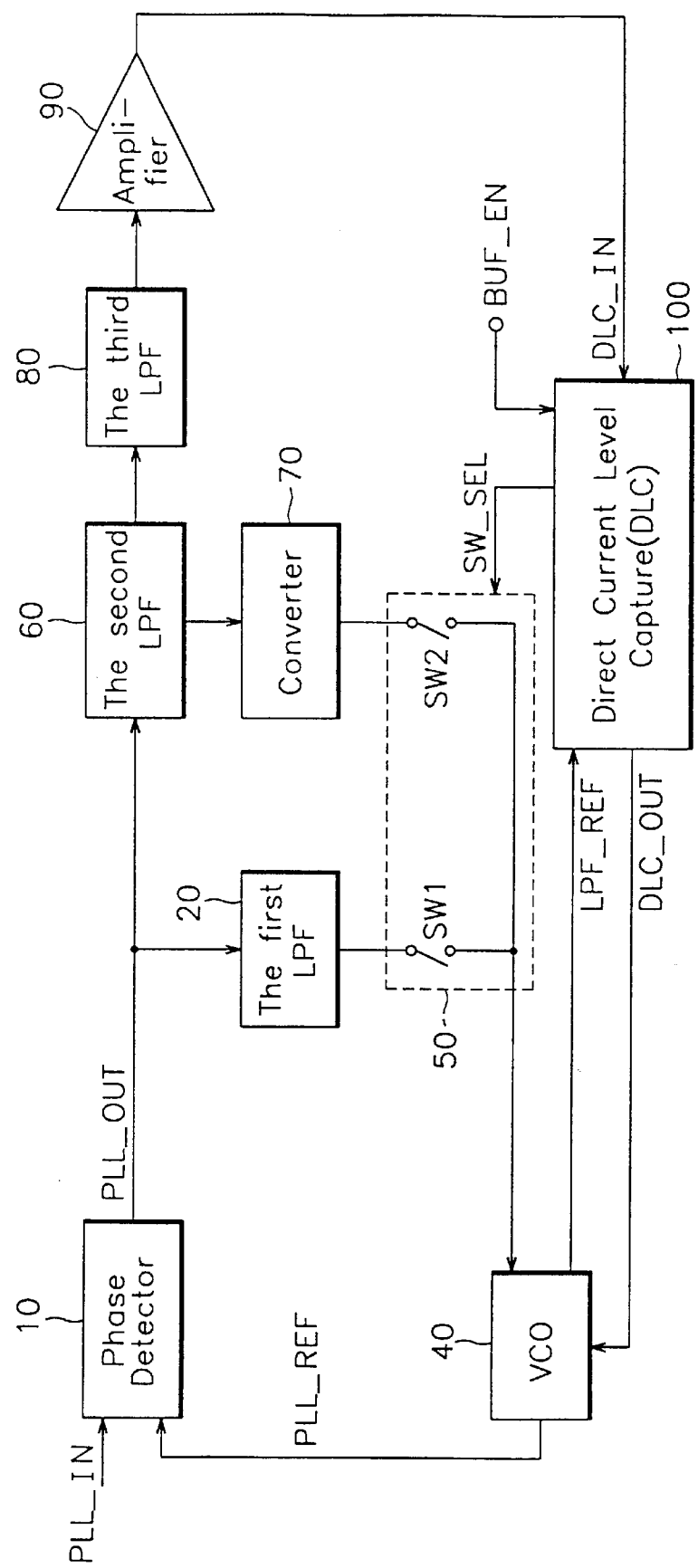
FIG. 2 is a block diagram of an embodiment of a phase locked loop circuit having a direct current level capture feature in accordance with the present invention.

An embodiment of a phase locked loop circuit in accordance with the present invention is shown in FIG. 2. Prior to describing the detailed structure of the phase locked loop of FIG. 2, the key components of the system will be identified and the operation of the system will be described briefly. Then a more detailed description of each of the components will be provided along with a more detailed description of the operation.

Referring to FIG. 2, an embodiment of a phase locked loop circuit according to the present invention includes a phase detector 10, a first low pass filter 20, a second low pass filter 60, a third low pass filter 80, a converter 70, a switching circuit 50, a direct current level capturing circuit 100, an amplifier 90 and a voltage controlled oscillator 40.

In operation, the phase detector 10 detects a phase difference between an input-signal PLL_IN and the vco-signal PLL_REF (also referred to as the oscillator signal) of the voltage controlled oscillator 40 (VCO), and outputs a first signal PLL_OUT in response to the phase difference between the two signals. The first low pass filter 20 attenuates frequencies which are higher than a first predetermined frequency from the first signal PLL_OUT and outputs a second signal to the switching circuit 50. The second low pass filter 60 attenuates frequencies which are higher than a second predetermined frequency from the first signal and outputs a third signal and a fourth signal to the third low pass filter 80 and the converter 70, respectively. The third low pass filter 80 attenuates frequencies which are higher than a third predetermined frequency from the third signal and outputs a first control signal DLC_IN.

The amplifier 90 can be used to amplify the first control signal DLC_IN, if the output of the phase locked loop, i.e., the first control signal DLC_IN, is at too low of a level to be manipulated in various applications.

The converter 70 increases the direct current component of the fourth signal and outputs a fifth signal to the switching circuit 50. The switching circuit 50 includes two switches SW1, SW2 which select either the second signal or the fifth signal in response to a switch selection signal SW_SEL and outputs the selected signal to the VCO 40. When the first switch SW1 is closed and the second switch SW2 is open, the first low pass filter 20 forms the feedback path between the phase detector 10 and the VCO 40. When the first switch SW1 is open and the second switch SW2 is closed, the feedback path between the phase detector 10 and the VCO 40 is formed by the second low pass filter 60 and the converter 70.

The direct current level capturing circuit 100 (also referred to as the control circuit) compares the first control signal DLC_IN with a reference voltage LPF_REF from the VCO 40, and outputs a second control signal DLC_OUT and the switch selection signal SW_SEL. The first control signal DLC_IN adjusts the reference voltage LPF_REF, and thus the free running frequency of the VCO. The switch selection signal SW_SEL causes the switching circuit 50 to supply the second signal to the VCO 40 when the voltage of the first control signal DLC_IN is the same as the reference voltage LPF_REF. The voltage controlled oscillator 40 outputs the vco-signal PLL_REF in response to the selected signal which is output from the switching circuit 50 and the reference voltage LPF_REF which is adjusted by the second control signal DLC_OUT.

Figure 3:
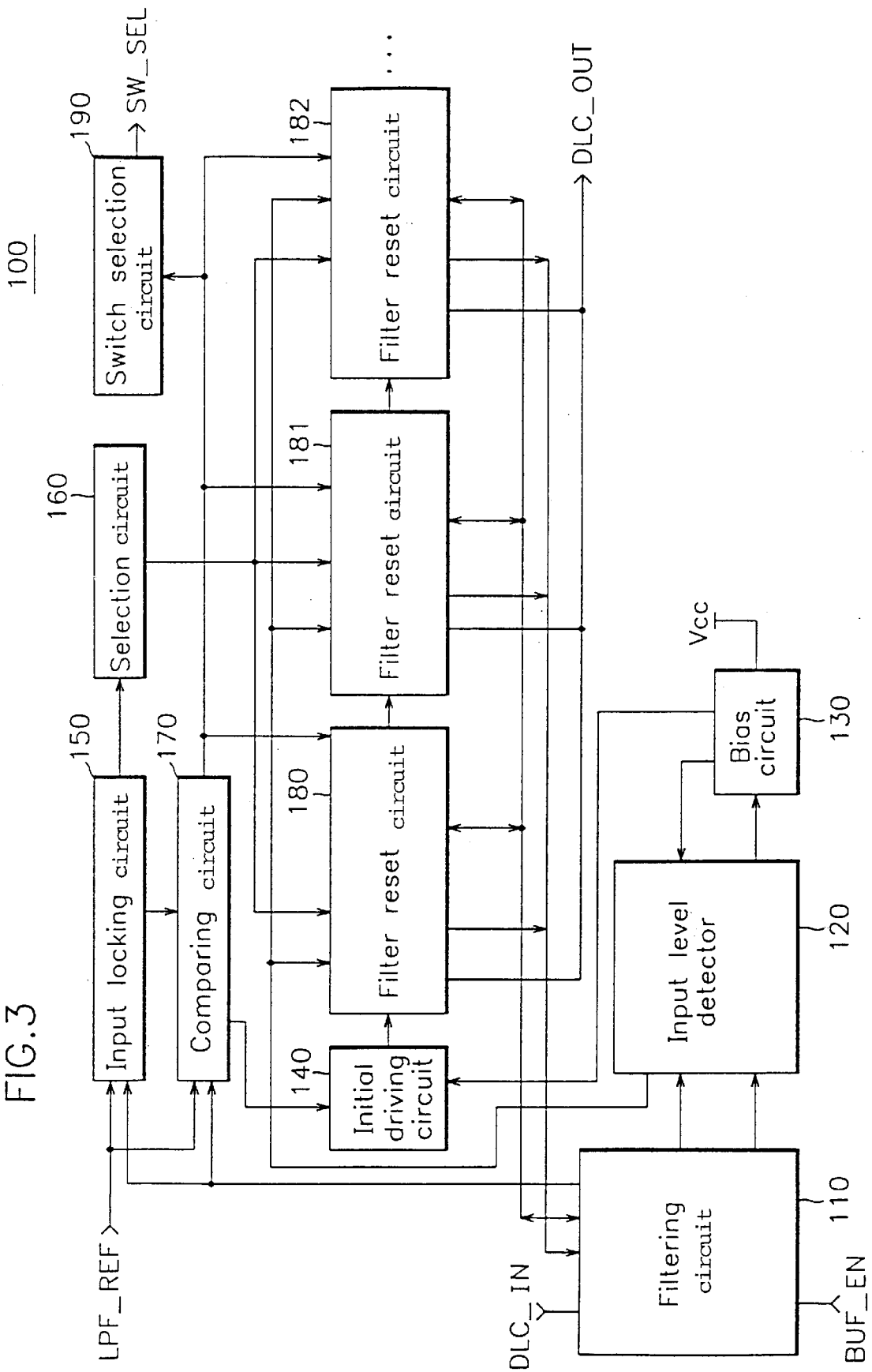
FIG. 3 is a block diagram of the direct current level capture feature of FIG. 2.

More detailed consideration will now be given to the structure of the PLL of FIG. 2. Referring to FIG. 3, the direct current level capturing circuit 100 includes a filtering circuit 110, an input level detector 120, a bias circuit 130, an input locking circuit 150, a comparing circuit 170, a selection circuit 160, an initial driving circuit 140, a switch selection circuit 190 and a plurality of filter-reset circuits 180, 181, and 182.

Figure 4:
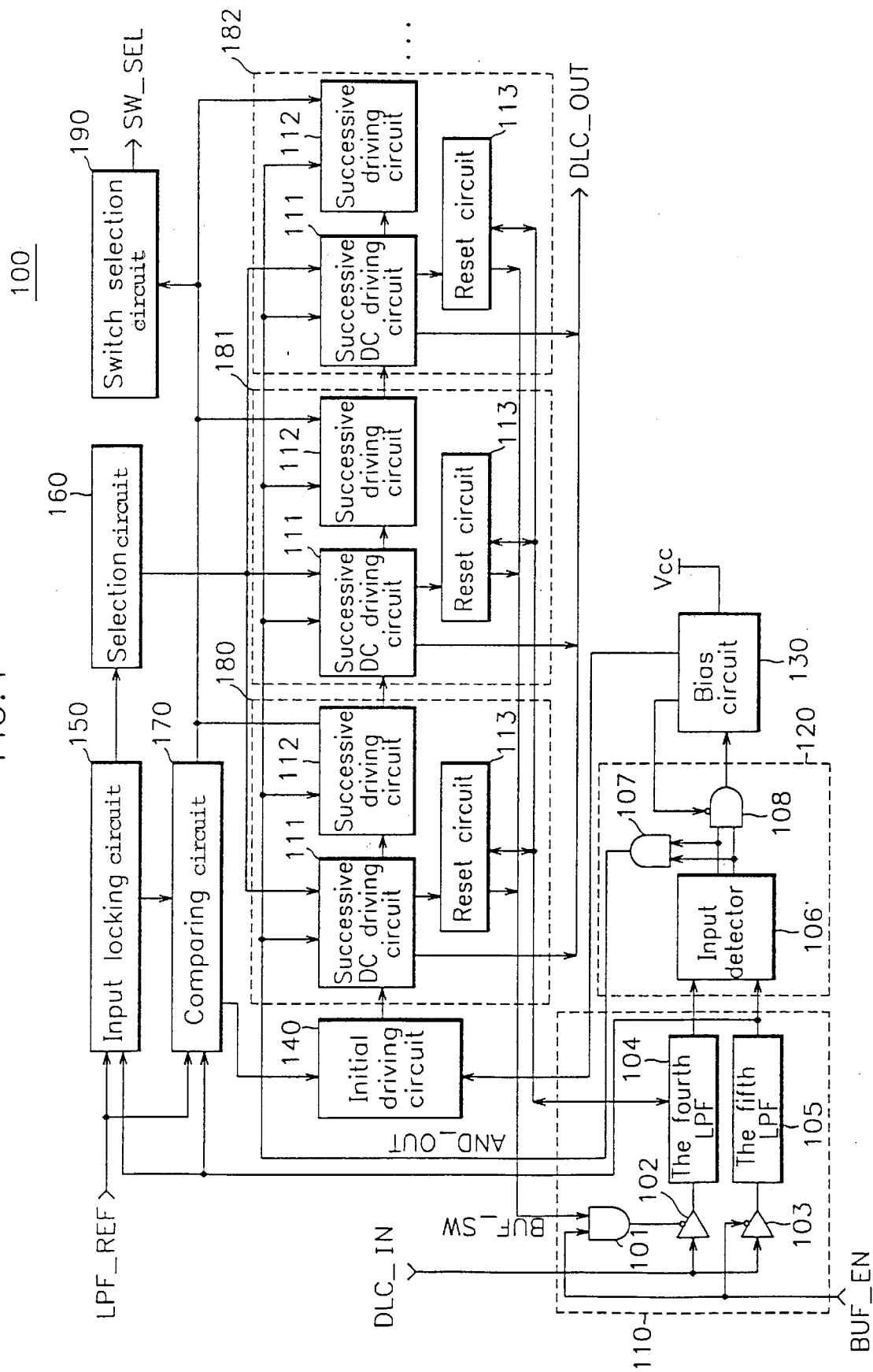
FIG. 4 is a block diagram showing more detail of the direct current level capture feature of FIG. 3.
Figure 5:
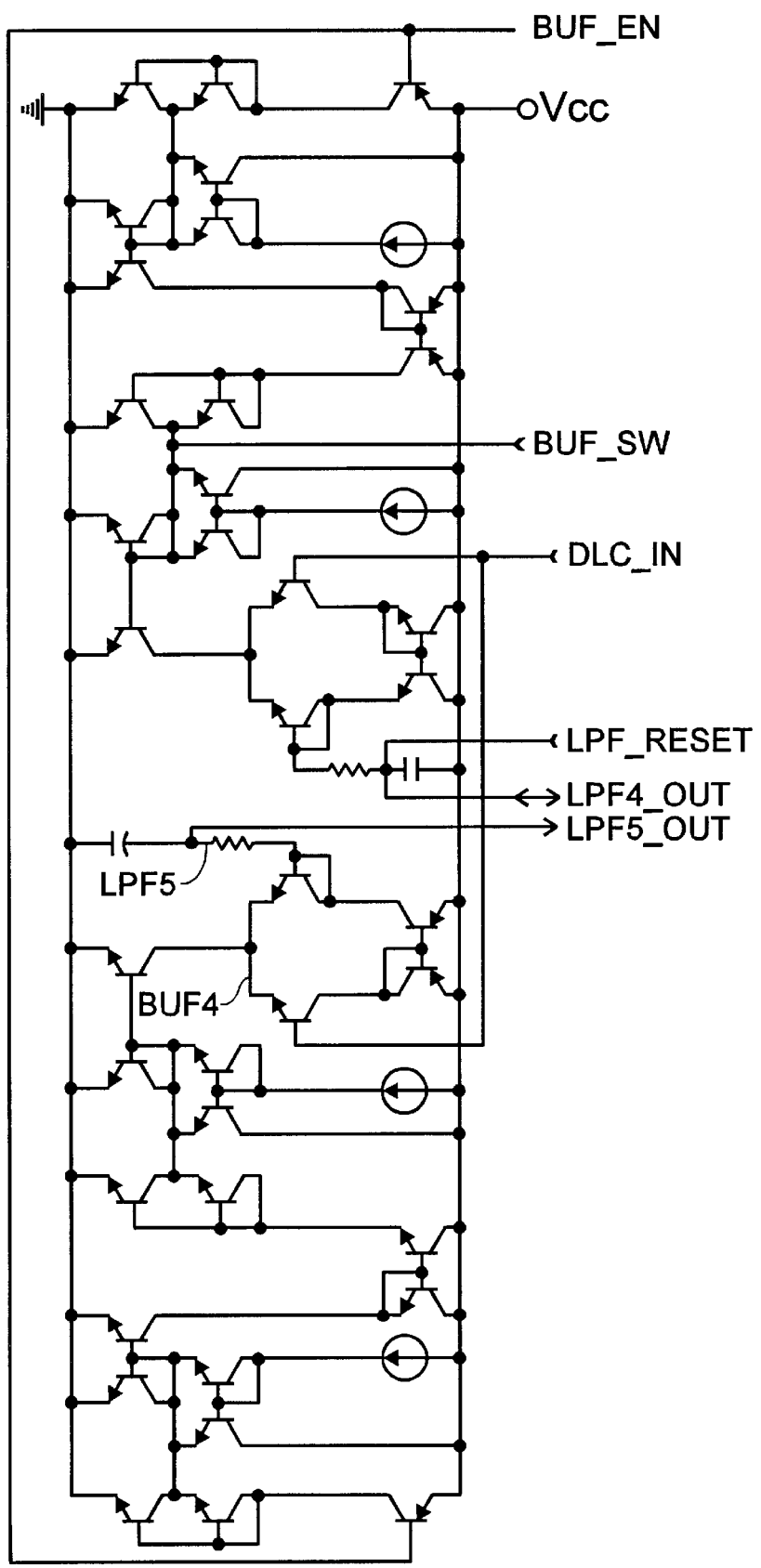
FIG. 5 is a schematic diagram of an embodiment of the filtering circuit of FIG. 3.
Figure 7:
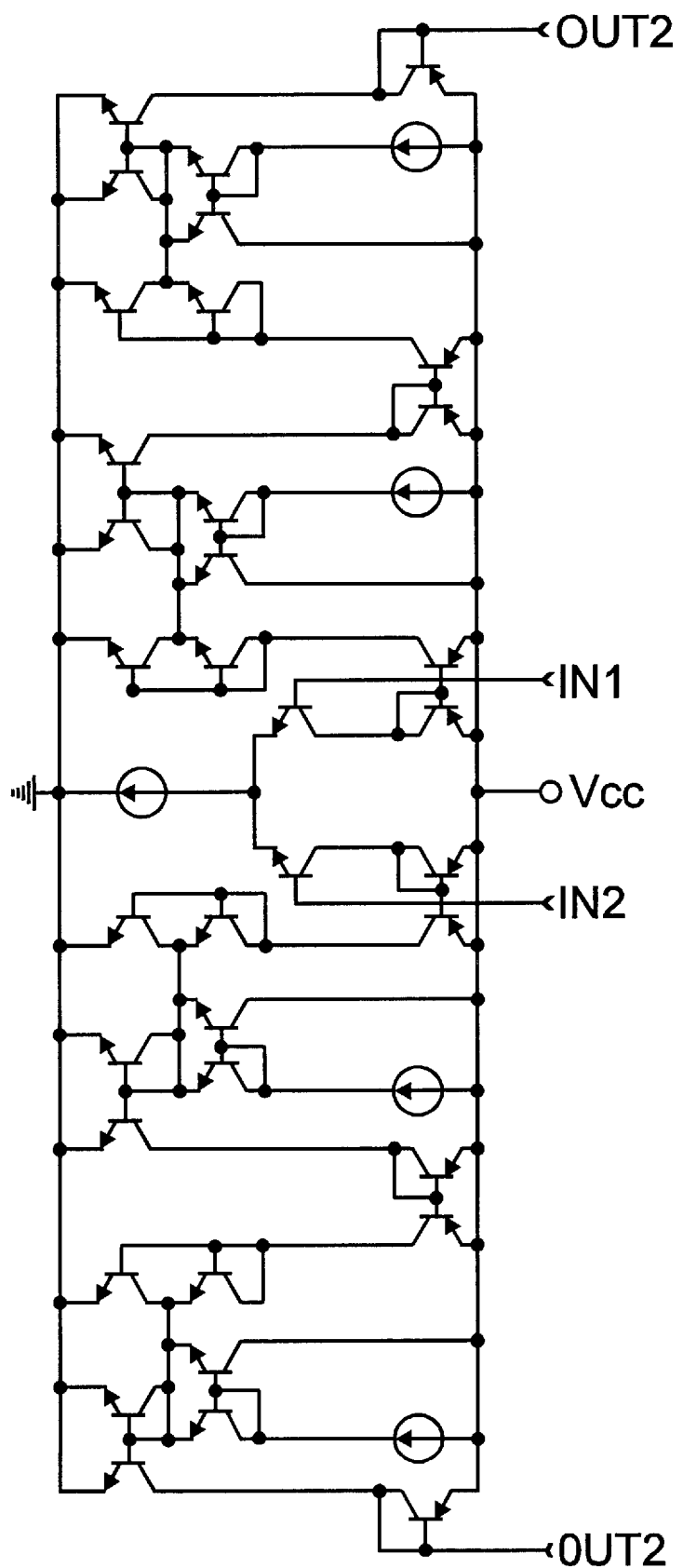
FIG. 7 is a schematic diagram of an embodiment of the input detector of FIG. 4.
Figure 8:
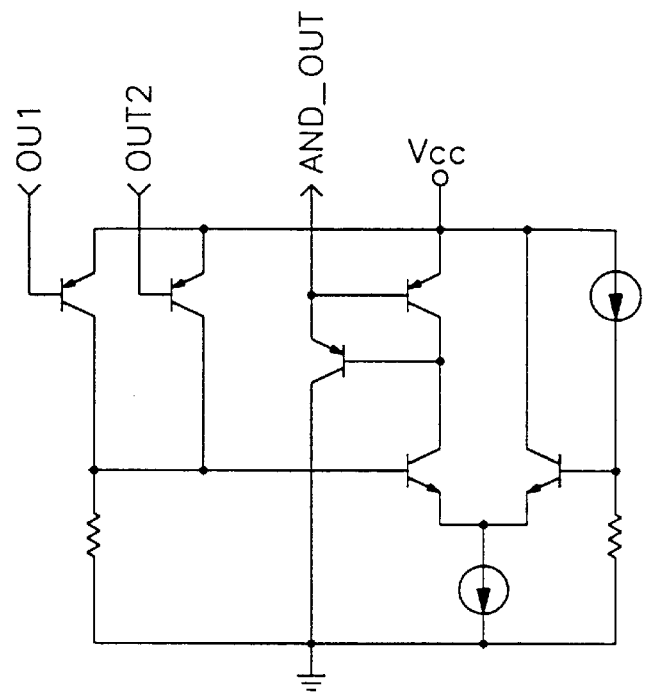
FIG. 8 is a schematic diagram of an embodiment of a third AND gate of the input level detector of FIG. 3.
Figure 9:
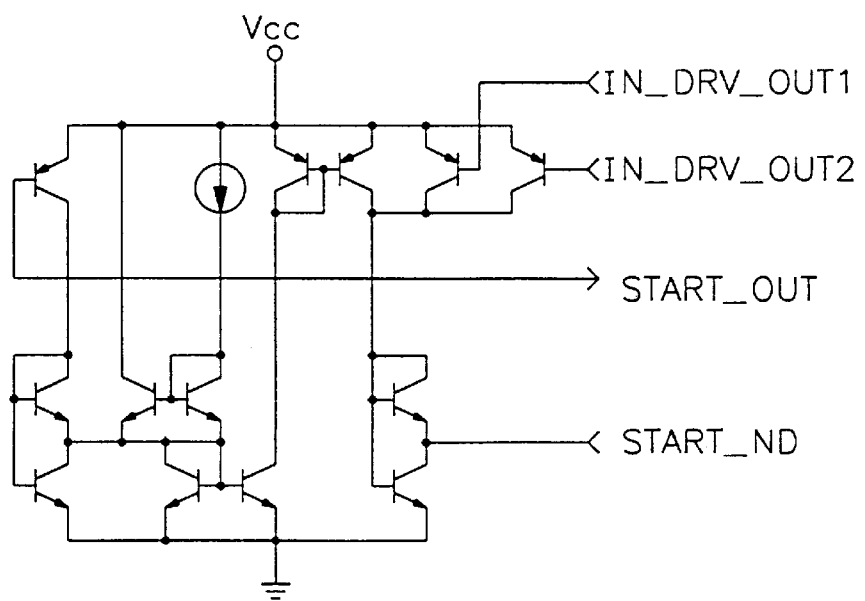
FIG. 9 is a schematic diagram of an embodiment of the initial driving circuit of FIG. 3.
Figure 10:
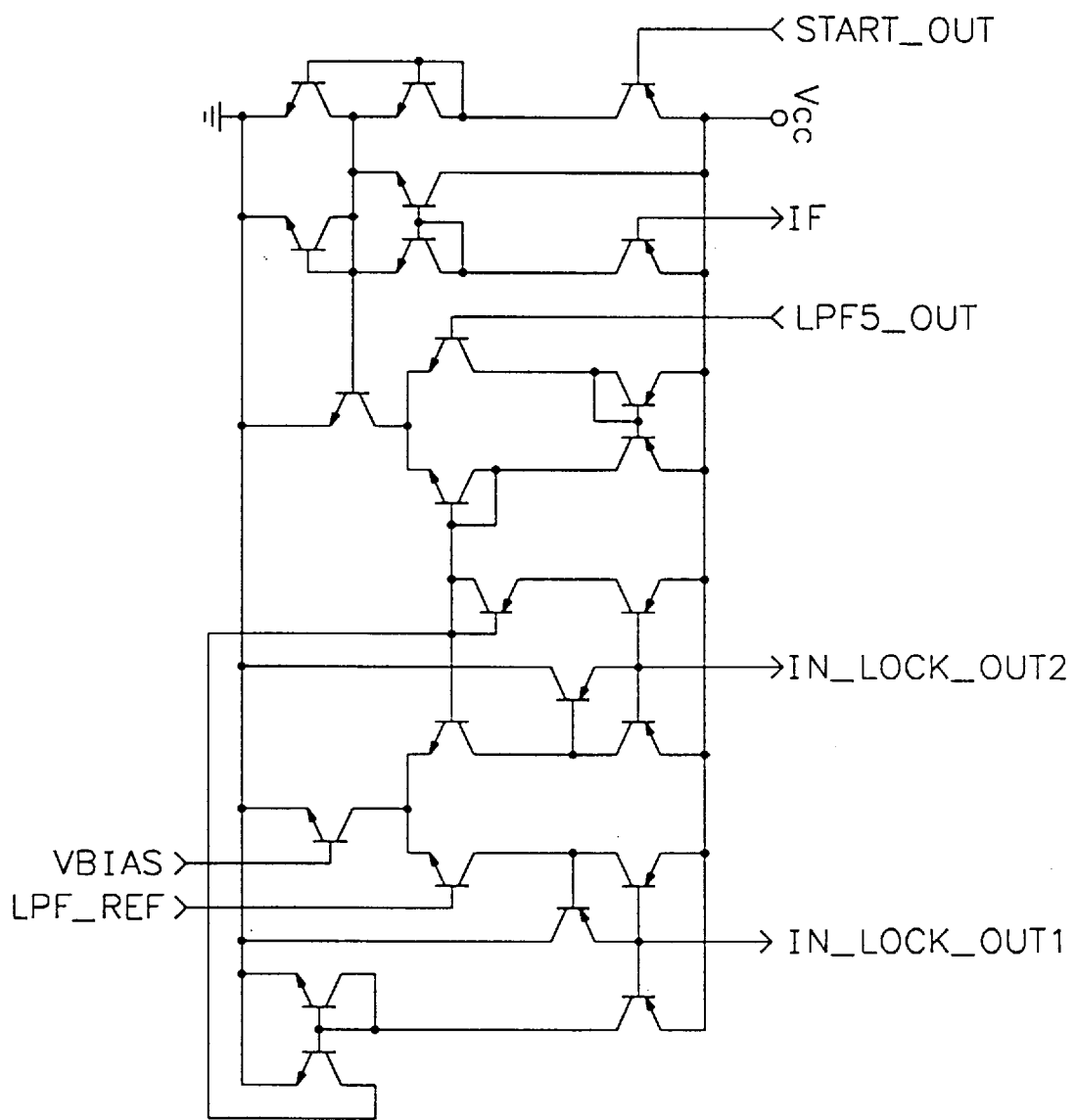
FIG. 10 is a schematic diagram of an embodiment of the input locking circuit of FIG. 3.
Figure 11:
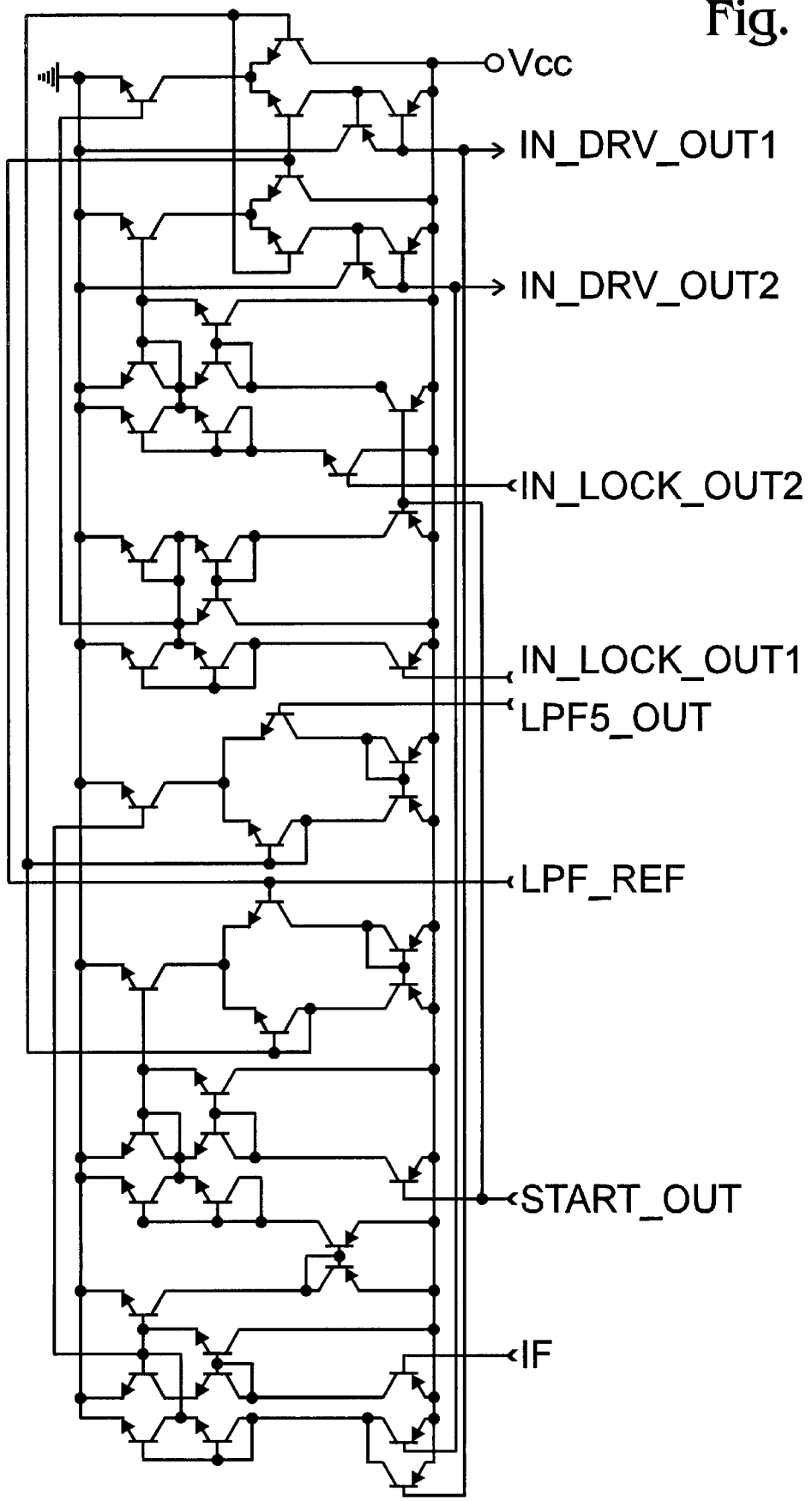
FIG. 11 is a schematic diagram of an embodiment of the comparing circuit of FIG. 3.
Figure 12:
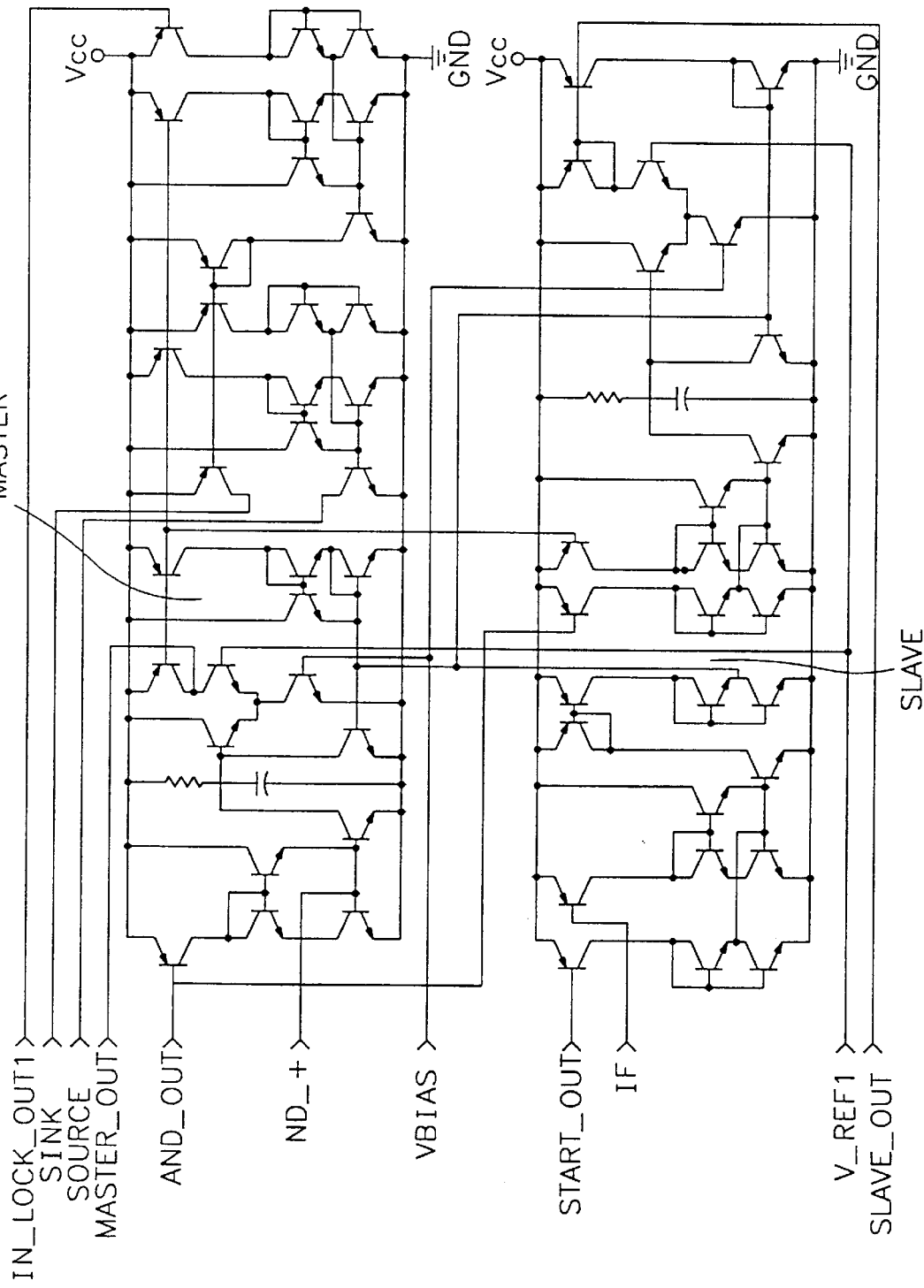
FIG. 12 is a schematic diagram of an embodiment of one of the successive DC driving circuits of FIG. 4.
Figure 13:
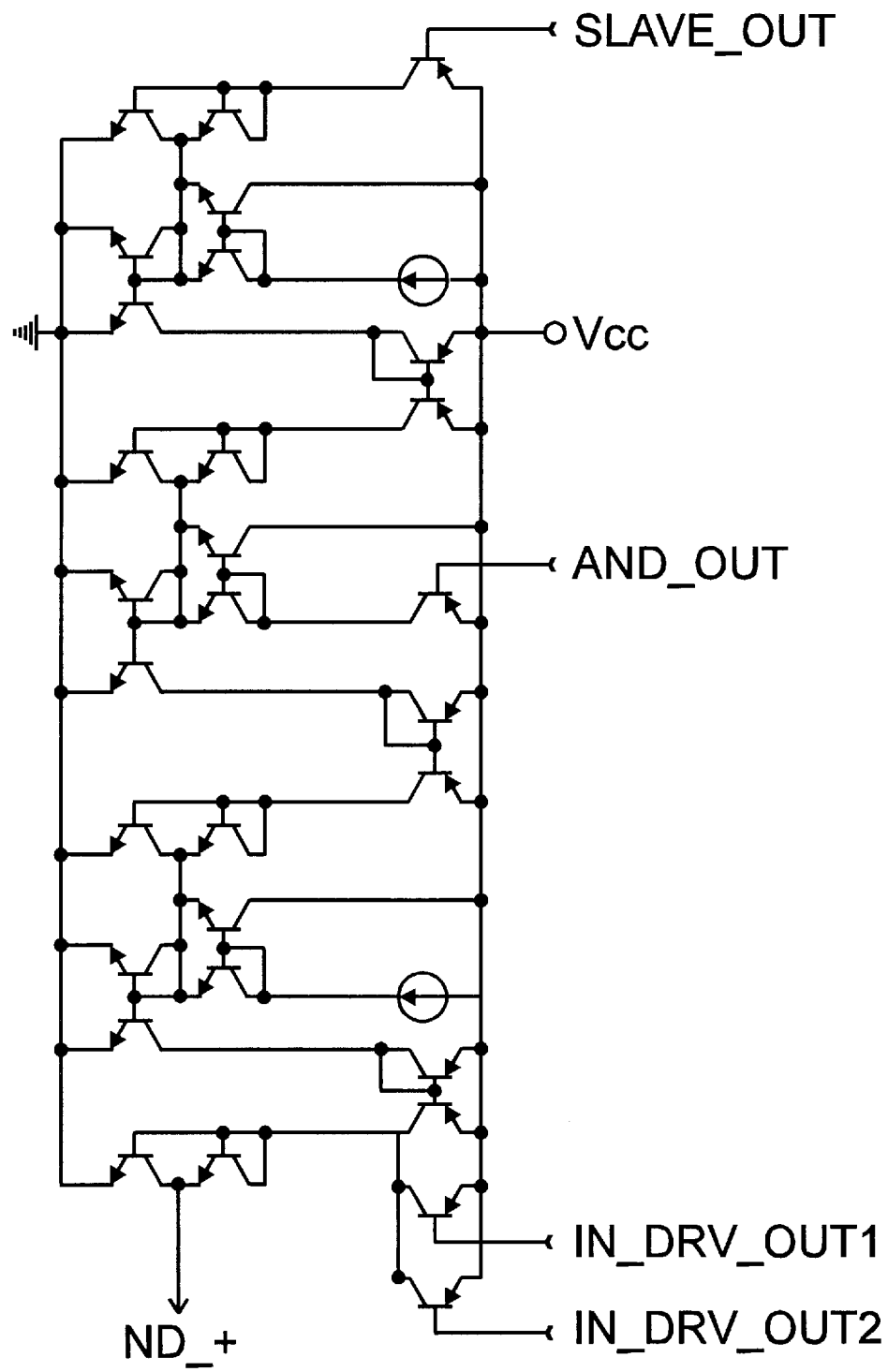
FIG. 13 is a schematic diagram of an embodiment of one of the successive driving circuits of FIG. 4.
Figure 14:
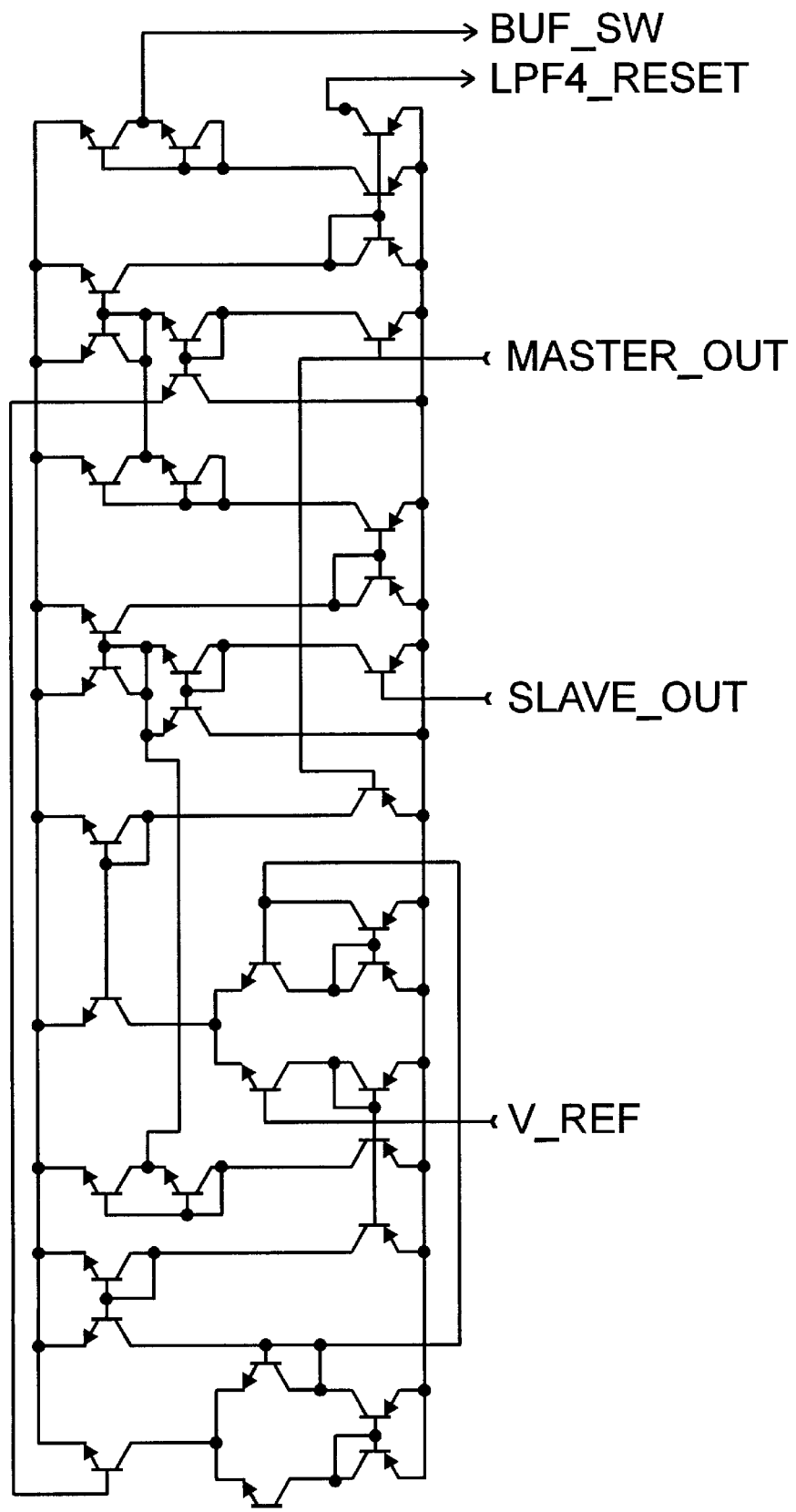
FIG. 14 is a schematic diagram of an embodiment of one of the reset circuits of FIG. 4.

As shown in FIGS. 3 and 4, the filtering circuit 110 is enabled by the buffer enable signal BUF_EN, which is generated when the input signal PLL_IN is input to the phase locked loop. Referring to FIG. 4, the filtering circuit 110 includes first and second filtering circuits 104, 105 which filter alternating current components from the first control signal DLC_IN and output first and a second filtered signals, respectively. A signal blocking circuit 101 blocks the first control signal input to the first filtering circuit 104 in response to a reset signal BUF_SW. The signal blocking circuit 101 includes a first AND gate 101 which receives the reset signal BUF_SW and a buffer enable signal BUF_EN. The filtering circuit 110 of the direct current level capturing circuit 100 further includes a first buffer 102 which is re-set by the output of the first AND gate 101 and passes the first control signal DLC_IN to the first filtering circuit 104. A second buffer 103, which is re-set by the buffer enable signal BUF_EN, passes the first control signal DLC_IN to the second filtering circuit 105.

The input level detector 120 outputs high logic level signals when the magnitude of the first and second filtered signals are the same. The input level detector 120 includes an input detector 106, a second AND gate 108 and a third AND gate 107. The input detector 106 outputs two high logic level signals when the magnitude of the first and second filtered signals are the same. The second AND gate 108 receives the outputs from the input detector 106 as input signals and drives the bias circuit 130. The second AND gate 108 is re-set by the bias circuit 130 when the output of the second AND gate 108 switches to a high logic level. The third AND gate 107 also receives the outputs of the input detector 106.

The input locking circuit 150 compares the second filtered signal with the reference voltage LPF_REF and outputs high or low logic signals in response to the compared result. The comparing circuit 170 also compares the second filtered signal with the reference voltage LPF_REF when it is enabled by the input locking circuit 150. Then the comparing circuit 170 enables successive driving circuits 112 and an initial driving circuit 140 in response to the compared result.

The selection circuit 160 controls the successive DC driving circuits 111 to source or sink current in response to the output signal from the input locking circuit 150.

The bias circuit 130 drives the initial driving circuit 140 instantaneously when the input level detector 120 outputs high logic level signals and resets the second AND gate 108. The initial driving circuit 140 receives the output of the bias circuit 130 and is enabled by the output of the comparing circuit 170 to output a first enable signal to the first of the successive DC driving circuits 111.

The plurality of filter-reset circuits 180, 181, and 182, which are serially connected, supply the second control signal DLC_OUT to the VCO 40. Each of the filter reset circuits 180, 181, and 182 includes a successive DC driving circuit 111, a successive driving circuit 112 and a reset circuit 113. The successive DC driving circuits 111 output the second control signal DLC_OUT in response to the outputs of the input level detector 120 and the selection circuit 160.

The first filter-reset circuit 180 is enabled by the first enable signal from the initial driving circuit 140. The successive driving circuit 112 of the first filter-reset circuit 180 is enabled by the successive DC driving circuit 111, the output of the input level detector 120, and the output of comparing circuit 170. The successive driving circuit 112 enables the successive DC driving circuit 111 of the following filter reset circuit 181. The reset circuit 113 outputs the reset signal to disable and reset the signal blocking circuit 101 and the first filtering circuit 104 in response to the output of the successive DC driving circuit 111.

The switch selection circuit 190 controls the switching circuit 50 in response to the output of the comparing circuit 170.

Each of the successive DC driving circuits 111 includes: a master driving circuit (Not shown) which outputs the second control signal DLC_OUT in response to the outputs of the input level detector 120 and the selection circuit 160; and a slave driving circuit (Not shown) which is enabled by the input level detector 120 and enables the successive driving circuit 111.

Figure 1:
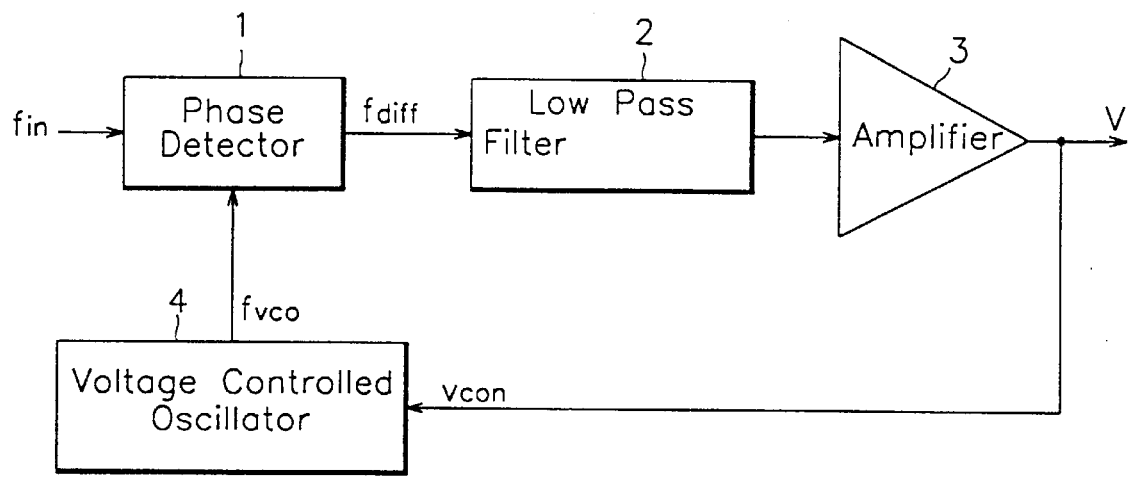
FIG. 1 is a block diagram of a prior art phase locked loop circuit.
Figure 6:
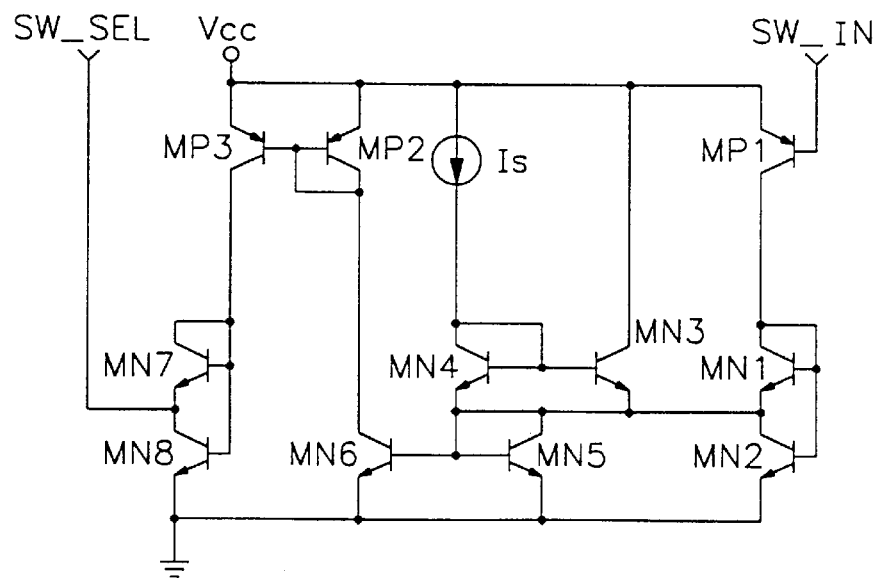
FIG. 6 is a schematic diagram of an embodiment of the switch selection circuit of FIG. 3.

Referring to FIG. 6, an embodiment of the switch selection circuit 190 of the direct current level capturing circuit 100 includes a first P-type transistor MP1 which has a base connected to the output terminal of the comparing circuit 170 and an emitter connected to a voltage source Vcc. A first N-type transistor MN1 has a collector which is connected to the collector of the first P-type transistor MP1 and a base which is connected back to its collector. A second N-type transistor MN2 has a collector which is connected to the emitter of the first N-type transistor MN1, a base which is connected to the base of the first N-type transistor MN1, and an emitter which is connected to a ground voltage. A third N-type transistor MN3 has a collector which is connected to the voltage source Vcc, and an emitter which is connected to the emitter of the first N-type transistor MN1. A current source Is has one electrode which is connected to the voltage source Vcc. A fourth N-type transistor MN4 has a collector which is connected to the other electrode of the current source Is, a base which is connected back to its collector and to the base of the third N-type transistor MN3, and an emitter which is connected to the emitter of the third N-type transistor MN3. A fifth N-type transistor MN5 has a collector which is connected to the emitter of the fourth N-type transistor MN4, a base which is connected to the collector of the fifth N-type transistor MN5, and an emitter is connected to the ground voltage. A second P-type transistor MP2 has an emitter which is connected to the voltage source Vcc, and a base and a collector which are connected together. A third P-type transistor MP3 has an emitter which is connected to the voltage source Vcc and a base which is connected to the base of the second P-type transistor MP2. A sixth N-type transistor MN6 has a collector which is connected to the collector of the second P-type transistor MP2, a base which is connected to the emitter of the fourth N-type transistor MN4, and an emitter which is connected to the ground voltage. A seventh N-type. transistor MN7 has a collector which is connected to the collector of the third P-type transistor MP3 and the base of the seventh N-type transistor MN7. An eighth N-type transistor MN8 has a base which is connected to the base of the seventh N-type transistor MN7, an emitter which is connected to a ground voltage, and a collector is connected to the emitter of the seventh N-type transistor MN7 and outputs a signal for controlling the switching circuit 50.

FIGS. 5 and 7 to 14 are circuit diagrams of embodiments of a filtering circuit 110, an input detector 106 of input level detector 120, a third AND gate 107, an initial driving circuit 140, an input locking circuit 150, a comparing circuit 170, a successive DC driving circuit 111, a successive driving circuit 112, and a reset circuit 113 of the direct current level capturing circuit 100 in accordance with the present invention, respectively. The circuit diagrams of FIGS. 5 and 7 to 14 are provided to show detailed examples of each the circuits; however, any other circuits which perform the equivalent functions can be used in place of the circuits of FIGS. 5 and 7 to 14.

More detailed consideration will now be given to the operation of the present invention with reference to FIG. 2. When the input-signal PLL_IN is supplied to the phase detector 10, the first switch SW1 is turned off, and the second switch SW2 is turned on. Thus, the input signal PLL_IN is input to the phase detector 10, and the signal flows through the second LPF 60, the converter 70 and the VCO 40. If the output of the PLL circuit is high, the converter 70 and the amplifier 90 are not necessary or the gains thereof can be reduced. The −3 dB point of the second LPF 60 is set to a high value so that the second LPF 60 has a wide capture range. The third low pass filter 80 attenuates high frequency components from the output of the second LPF 60 and outputs a first control signal DLC_IN. The amplifier 90 can be used to amplify the first control signal DLC_IN if the output of the phase locked loop, i.e., the first control signal DLC-IN, is too low for a particular application.

The direct current level capturing circuit 100 rectifies the first control signal DLC_IN and compares the first control signal DLC_IN with the reference voltage LPF_REF. If the first control signal DLC_IN and the reference voltage LPF_REF have the same magnitude, the direct current level capturing circuit 100 turns on the first switch SW1, and turns off the second switch SW2, and thus, the phase locked loop is operated in a normal mode. However, if the first control signal DLC_IN and the reference voltage LPF_REF are different from each other, the direct current level capturing circuit 100 outputs the second control signal DLC_OUT to adjust the free running frequency of the VCO 40. Then, when the magnitudes of the first control signal DLC_IN and the reference voltage LPF_REF equalize due to the operation of the system, the direct current level capturing circuit 100 turns on the first switch SW1, and turns off the second switch SW2, thereby causing the phase locked loop to operate in a normal mode.

Referring to FIGS. 3 and 4, when the input-signal PLL_IN is supplied to the phase detector 10, a buffer enable signal BUF_EN enables the first and second buffers 102 and 103 of the filtering circuit 110. When the first and second buffers 102, 103 are enabled, the fourth and fifth low pass filters LPF 104 and LPF 105 attenuate the alternating current components of the first control signal DLC_IN. If the outputs of the fourth and fifth LPFs 104, 105 are the same, the input level detector 106, which detects whether the input signals are identical or not, converts the outputs of the LPFs 104, 105 into high logic level signals, which in turn, causes the second and third AND gates 108, 107 to output high logic level signals.

The PLL circuit is sufficiently stabilized during the time interval in which the outputs of the fourth and fifth LPFs 104, 105 are changed from their initial reset values to the first control signal value DLC_IN by the buffers 102,103.

When the second AND gate 108 outputs a High logic level signal, the bias circuit 130 turns on, instantly drives the initial driving circuit 140, and, at the same time, disables the second AND gate 108.

The output signal AND_OUT of the third AND gate 107 is input to successive driving circuits 111 and successive DC driving circuits 112, and periodically and sequentially enables one of the filter reset circuits 180, 181, 182, etc.

The output of the fifth LPF 105 is supplied to the input-locking circuit 150 and the comparing circuit 170. The input-locking circuit 150 compares the reference voltage LPF_REF from the voltage controlled oscillator 40 with the output of the fifth LPF 105, and outputs a high logic level signal if the output of the fifth LPF 105 is higher than the reference voltage LPF_REF. The selection circuit 160 receives the output of the input-locking circuit 150 and controls the operation, i.e., sinking or sourcing, of each successive DC driving circuit 111.

The comparing circuit 170 compares the reference voltage LPF_REF from the voltage controlled oscillator 40 with the output of the fifth LPF 105. The comparing circuit 170 enables all of the successive-driving circuits 112 when the output of the fifth LPF 105 is not the same as the reference voltage LPF_REF and disables all of the successive-driving circuits 112 when the output of the fifth LPF 105 is same as the reference voltage LPF_REF.

When the bias circuit 130 is turned on and the comparing circuit 170 enables the successive driving circuits 112, the initial-driving circuit 140 is ready to enable the filter reset circuit 180. At this time, if the output of the third AND gate 107 is at a high logic level, a master driving circuit of the successive DC-driving circuit 111 of the filter-reset circuit 180 is enabled, and the slave driving circuit of the successive driving circuit 112 of the filter reset circuit 180 is disabled. Then, the second control signal DLC_OUT is output to the VCO 40 from the first filter reset circuit 180.

By enabling the master driving circuit, the reset circuit 113 disables the first buffer 102 and resets the fourth LPF 104 to the voltage Vcc. This causes the output of the fourth LPF 104 to become different from the output of the fifth LPF 105, thereby causing the third AND gate 107 to output a low logic level signal. If the output of the third AND gate 107 is at a low logic level, the slave driving circuit of the successive DC driving circuit 111 is enabled and outputs a signal to enable the successive driving circuit 112. Thereafter, if the successive driving circuit 112 receives a high logic level signal from the third AND gate 107, the successive driving circuit 112 enables the master driving circuit of the successive DC driving circuit 111 of the following filter reset circuit 181. The reset circuit 113 disables the first buffer 102 again.

After the fourth LPF 104 is again set to the voltage Vcc, the reset circuit 113 again enables the first buffer 102. Then the output of the fourth LPF 104 recovers so that it has the same value as the output signal of the fifth LPF 105, that is, the first control signal of the amplifier 90. At this time, the reference voltage LPF_REF has a value closer to the first control signal DLC_IN than its initial value since the magnitude of reference voltage LPF_REF of the VCO is changed by the second control signal DLC_OUT which is supplied from the filter reset circuit 180 to the VCO.

When the outputs of the fourth and fifth low pass filters LPF 104 and LPF 105 equalize, the third AND gate 107 outputs high logic level signal which enables the master driving circuit of successive DC-driving circuit 111 of the filter reset circuit 181. Then, the second control signal DLC_OUT is supplied to the VCO 40 from the second filter reset circuit 181. In this way, the reference voltage LPF_REF is adjusted to-a value equal to that of the first control signal DLC_IN.

If the free running frequency of the VCO 40 is adjusted by enabling the filter reset circuits 180,181,182, thus changing the reference voltage to the value of the first control signal by the above-described procedure, the comparing circuit 170 disables the successive driving circuits 112 of the filter reset circuits 180, 181, 182. In this manner, the comparing circuit 170 stabilizes the PLL circuit by supplying the reference voltage as the output of the fifth LPF 105. When the comparing circuit 170 outputs a signal to disable the successive driving circuit 112, the first switch SW1 is turned on and the second switch SW2 is turned off.

The direct current level capturing circuit 100 adjusts the free running frequency of the VCO 40 by repeating the above procedure, thereby adjusting the free running frequency of the VCO 40 by adjusting the direct current which is supplied to the signal producing part of the VCO 40. Thus, the present invention automatically controls the free running frequency of the VCO and provides more stable operation of the PLL circuit.

Having described and illustrated the principles of the invention in a preferred embodiment thereof, it should be apparent that the invention can be modified in arrangement and detail without departing from such principles. We claim all modifications and variations coming within the spirit and scope of the following claims.

I claim:
1. A phase locked loop comprising:
   a phase detector for generating an output signal responsive to an input signal and an oscillator signal;
   a controlled oscillator coupled to the phase detector to generate the oscillator signal responsive to the output signal, the free running frequency of the controlled oscillator being controlled responsive to a control signal; and
   a control circuit coupled to the controlled oscillator to generate the control signal responsive to the output signal; wherein:
      the controlled oscillator generates a reference signal indicative of the free running frequency; and
      the control circuit generates the control signal so as to equalize the reference signal and the output signal.
2. A phase locked loop according to claim 1 further including a low pass filter and an amplifier coupled in series between the phase detector and the control circuit.
3. A phase locked loop comprising:
   a phase detector for generating an output signal responsive to an input signal and an oscillator signal;
   a controlled oscillator coupled to the phase detector to generate the oscillator signal responsive to the output signal, the free running frequency of the controlled oscillator being controlled responsive to a control signal;
   a control circuit coupled to the controlled oscillator to generate the control signal responsive to the output signal;
   a switch circuit coupled to the controlled oscillator;
   a first feedback path coupled between the phase detector and the switch circuit; and
   a second feedback path coupled between the phase detector and the switch circuit;
   wherein the switch circuit selects one of the feedback paths responsive to a switch signal.
4. A phase locked loop according to claim 3 wherein the first feedback path includes a low pass filter.
5. A phase locked loop according to claim 3 wherein the second feedback path includes a low pass filter coupled in series with a converter.
6. A phase locked loop according to claim 3 wherein:
   the controlled oscillator generates a reference signal indicative of the free running frequency; and
   the control circuit generates the switch signal so as to select the first feedback path when the reference signal and the output signal are not equalized, and to select the second feedback path when the reference signal and the output signal are equalized.
7. A phase locked loop comprising:
   a phase detector for generating an output signal responsive to an input signal and an oscillator signal;
   a controlled oscillator coupled to the phase detector to generate the oscillator signal responsive to the output signal, the free running frequency of the controlled oscillator being controlled responsive to a control signal; and
   a control circuit coupled to the controlled oscillator to generate the control signal responsive to the output signal;
   wherein the control circuit is a direct current level capture circuit having an input terminal for receiving a reference signal indicative of the free running frequency of the controlled oscillator, wherein the direct current level capture circuit generates the control signal by comparing the output signal to the reference signal so as to equalize the reference signal and the output signal.
8. A direct current level capture circuit comprising:
   a filter circuit for generating a first filtered signal and a second filtered signal responsive to an input signal, the first filtered signal being disabled responsive to a reset signal;
   an input level detector coupled to the filter circuit, the input level detector generating a logic signal when the first and second filtered signals are equal;
   a comparing circuit coupled to the filter circuit, the comparing circuit generating a first enable signal and a second enable signal responsive to the second filtered signal and an input signal;
   an initial driving circuit coupled to the comparing circuit and the input level detector, the initial driving circuit generating a third enable signal responsive to the first enable signal and the logic signal; and
   a filter reset circuit coupled to the filter circuit, the initial driving circuit, and the comparing circuit, the filter reset circuit generating a control signal and the reset signal responsive to the second and third enable signals.
9. A circuit according to claim 8 wherein the comparing circuit enables the initial driving circuit and the filter reset circuit when the second filtered signal and the input signal are the same.
10. A circuit according to claim 8 further including a second filter reset circuit coupled to the filter circuit, the first filter reset circuit, and the comparing circuit, the second filter reset circuit generating the control signal and the reset signal responsive to the second and third enable signals, wherein the first and second filter reset circuits are periodically and sequentially enabled.
11. A circuit according to claim 10 further including a switch selection circuit coupled to the comparing circuit to generate a switch selection signal responsive to the second enable signal.
12. A circuit according to claim 8 wherein the filter circuit includes:
   a fourth low pass filter for generating the first filtered signal responsive to the input signal;
   a fifth low pass filter for generating the second filtered signal responsive to the input signal;
   a first buffer coupled to the fourth low pass filter to couple the input signal to the fourth low pass filter responsive to a buffer enable signal and the reset signal;
   a second buffer coupled to the fifth low pass filter to couple the input signal to the fifth low pass filter responsive to the buffer enable signal; and
   a logic gate coupled between the first buffer and the filter reset circuit to combine the buffer enable signal and the reset signal.

13. A circuit according to claim 8 further including:

an input locking circuit coupled to the filter circuit and the comparing circuit, the input locking circuit generating a fourth enable signal when the input signal and the second filtered signal are the same; and a selection circuit coupled to the input locking circuit, the selection circuit generating a fifth enable signal responsive to the fourth enable signal.

14. A circuit according to claim 13 wherein the filter reset circuit includes:

a successive DC driving circuit for generating the output signal responsive to the second enable signal, the third enable signal, and the logic signal;

a successive driving circuit coupled to the successive DC driving circuit for enabling a successive filter reset circuit responsive to the fifth enable signal; and a reset circuit coupled between the successive DC driving circuit and the filter circuit, the reset circuit disabling the first buffer and causing the output of the fourth low pass filter to change to a power supply voltage when the first and second filtered signals are equal.

15. A circuit according to claim 8 further including a second filter reset circuit coupled to the filter circuit, the first filter reset circuit, and the comparing circuit, the second filter reset circuit generating the control signal and the reset signal responsive to the second enable signal, wherein the first and second filter reset circuits are periodically and sequentially enabled.

16. A method of operating a phase locked loop, the loop comprising a phase detector for generating an output signal responsive to an input signal and an oscillator signal, and a controlled oscillator coupled to the phase detector to generate the oscillator signal responsive to the output signal, the method comprising adjusting the free running frequency of the controlled oscillator responsive to the output signal from the phase detector; wherein:

the controlled oscillator generates a reference signal indicative of the free running frequency; and adjusting the free running frequency includes adjusting the free running frequency so as to equalize the reference signal and the output signal.

17. A method according to claim 16 wherein adjusting the free running frequency includes;

filtering the output signal from the phase detector, thereby generating a filtered signal;

comparing the reference signal to the filtered signal, thereby generating an enable signal;

coupling a series of filter reset circuits to the controlled oscillator, each filter reset circuit generating a control signal for adjusting the free running frequency of the controlled oscillator responsive to the enable signal; and periodically and sequentially enabling the series of filter reset circuits until the reference signal and the output signal are equalized.

18. A method of operating a phase locked loop, the loop comprising a phase detector for generating an output signal responsive to an input signal and an oscillator signal, and a controlled oscillator coupled to the phase detector to generate the oscillator signal responsive to the output signal, the method comprising:

adjusting the free running frequency of the controlled oscillator responsive to the output signal from the phase detector; and selecting between a first feedback path and a second feedback path between the controlled oscillator and the phase detector.

19. A method according to claim 18 wherein:

the controlled oscillator generates a reference signal indicative of the free running frequency; and selecting between the first and second feedback paths includes selecting the first feedback path when the reference signal and the output signal are not equalized, and selecting the second feedback path when the reference signal and the output signal are equalized.

* * * * *